United States Patent
Harada et al.

(10) Patent No.: US 10,741,738 B2
(45) Date of Patent: Aug. 11, 2020

(54) SEMICONDUCTOR LIGHT-EMITTING APPARATUS HAVING MULTIPLE SEMICONDUCTOR LIGHT-EMITTING ELEMENTS AND ITS MANUFACTURING METHOD

(71) Applicant: STANLEY ELECTRIC CO., LTD., Meguro-ku, Tokyo (JP)

(72) Inventors: Mitsunori Harada, Tokyo (JP); Kaori Tachibana, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/202,783

(22) Filed: Nov. 28, 2018

(65) Prior Publication Data

US 2019/0172990 A1 Jun. 6, 2019

(30) Foreign Application Priority Data

Dec. 6, 2017 (JP) ................................ 2017-234000

(51) Int. Cl.
*H01L 33/62* (2010.01)
*H01L 33/60* (2010.01)
*H01L 25/075* (2006.01)
*H01L 33/50* (2010.01)
*H01L 33/54* (2010.01)
*H01L 33/56* (2010.01)

(52) U.S. Cl.
CPC .......... *H01L 33/62* (2013.01); *H01L 25/0753* (2013.01); *H01L 33/505* (2013.01); *H01L 33/60* (2013.01); *H01L 33/54* (2013.01); *H01L 33/56* (2013.01); *H01L 2933/005* (2013.01); *H01L 2933/0041* (2013.01); *H01L 2933/0066* (2013.01)

(58) Field of Classification Search
CPC ..... H01L 51/56; H01L 51/5253; H01L 23/66; H01L 45/1608; C09K 11/06
USPC .......................................................... 257/88
See application file for complete search history.

(56) References Cited

U.S. PATENT DOCUMENTS 9,147,814 B2 9/2015 Waragaya
2014/0110736 A1 4/2014 Waragaya
(Continued)

FOREIGN PATENT DOCUMENTS

JP 2014086549 A 5/2014

*Primary Examiner* — Andy Huynh
(74) *Attorney, Agent, or Firm* — Holtz, Holtz & Volek PC

(57) ABSTRACT

A method for manufacturing a semiconductor light-emitting apparatus includes: forming multiple eutectic material layers on multiple first electrode patterns, respectively, of a wiring substrate; mounting multiple semiconductor light-emitting elements on the multiple eutectic material layers, respectively; mounting a plate on the multiple semiconductor light-emitting elements via multiple eutectic temperature liquid layers, respectively, the multiple eutectic temperature liquid layers maintaining a liquid state even at a eutectic temperature of the multiple eutectic material layers; and heating and cooling the multiple eutectic material layers and the multiple temperature liquid layers while the plate is adhered via the multiple eutectic temperature liquid layers to the multiple semiconductor light-emitting elements by the surface tension phenomenon.

10 Claims, 11 Drawing Sheets

(56) References Cited

U.S. PATENT DOCUMENTS

| | | | |
|---|---|---|---|
| 2015/0364650 A1* | 12/2015 | He | H01L 33/508 |
| | | | 257/88 |
| 2016/0211415 A1* | 7/2016 | Huang | H01L 33/62 |
| 2016/0351620 A1* | 12/2016 | Tanaka | H01L 33/50 |
| 2018/0040790 A1* | 2/2018 | Ono | H01L 25/0753 |

* cited by examiner

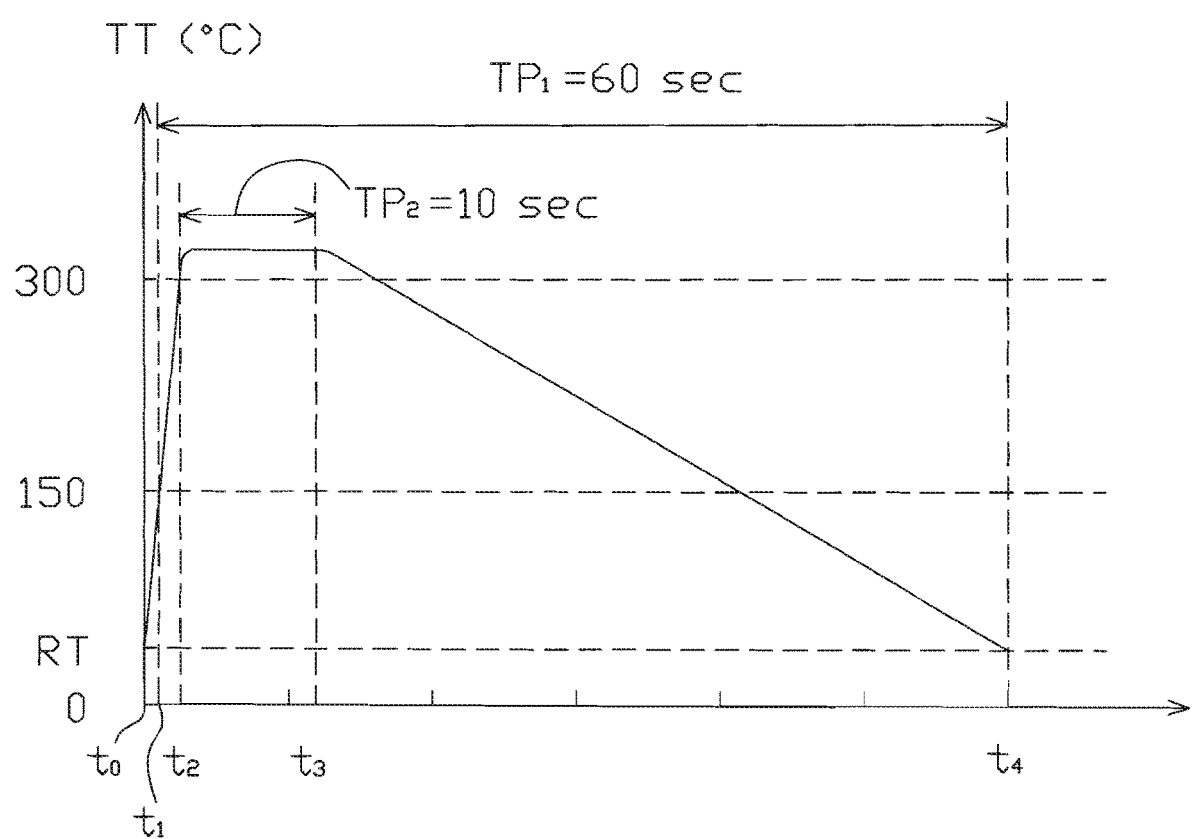

SEMICONDUCTOR LIGHT-EMITTING APPARATUS HAVING MULTIPLE SEMICONDUCTOR LIGHT-EMITTING ELEMENTS AND ITS MANUFACTURING METHOD

This application claims the priority benefit under 35 U.S.C. § 119 to Japanese Patent Application No. JP2017-234000 filed on Dec. 6, 2017, which disclosure is hereby incorporated in its entirety by reference.

BACKGROUND

Field

The presently disclosed subject matter relates to a semiconductor light-emitting apparatus such as a white-light light-emitting diode (LED) apparatus and its manufacturing method.

Description of the Related Art

Generally, a semiconductor light-emitting apparatus such as a white-light LED apparatus is used as an illumination apparatus such as a vehicle headlamp, a street lamp or a conventional lamp.

A prior art semiconductor light-emitting apparatus is constructed by a wiring substrate, a semiconductor light-emitting element mounted via a conductive eutectic layer on the substrate, and a wavelength-converting plate such as a phosphor plate adhered to the upper surface of the semiconductor light-emitting element via a transparent adhesive layer. The wavelength-converting plate includes phosphor for converting a part of light emitted by the semiconductor light-emitting element into wavelength-converted light with a longer wavelength than that of the emitted light of the semiconductor light-emitting element, thereby mixing light directly emitted from the semiconductor light-emitting element with the wavelength-converted light into desired light such as white light (see: JP2014-86549A).

The above-mentioned prior art semiconductor light-emitting apparatus can be applied to a semiconductor light-emitting apparatus having multiple semiconductor light-emitting elements, to thereby increase the luminance intensity. In this case, the semiconductor light-emitting elements are mounted via multiple eutectic layers, respectively, on the substrate. On the other hand, one wavelength-converting plate can be adhered to the upper surfaces of the semiconductor light-emitting elements via multiple relatively thick transparent adhesive layers, respectively.

In the above-described semiconductor light-emitting apparatus having multiple semiconductor light-emitting elements, however, since there are actually fluctuations of the heights and slopes in the semiconductor light-emitting elements while the thicknesses of the eutectic layers are uniform, the heights of the upper surfaces of the semiconductor light-emitting elements relative to the substrate would greatly fluctuate. For example, the difference in height among the semiconductor light-emitting elements is larger than 45 μm, which means that the standard deviation σ1' of thicknesses of the transparent adhesive layers is large while the standard deviation σ2' of thicknesses of the eutectic layers is small, so that the spacings between the wavelength-converting plate and each of the semiconductor light-emitting elements also would greatly fluctuate. Thus, the heat resistances between the wavelength-converting plate and each of the semiconductor light-emitting elements would greatly fluctuate, so that luminance intensities of the semiconductor light-emitting elements would not be uniform, and also, the color unevenness among the semiconductor light-emitting elements would occur.

The standard deviations will be explained later in detail.

SUMMARY

The presently disclosed subject matter seeks to solve the above-described problems.

According to the presently disclosed subject matter, a semiconductor light-emitting apparatus includes: a wiring substrate; multiple semiconductor light-emitting elements mounted via multiple eutectic layers, respectively, on the wiring substrate; and a wavelength-converting plate via multiple transparent adhesive layers on upper surfaces of the semiconductor light-emitting elements, respectively. A standard deviation σ1 of thicknesses of the transparent adhesive layers is smaller than a standard deviation σ2 of thicknesses of the eutectic layers.

Also, a method for manufacturing the above-mentioned semiconductor light-emitting apparatus includes: forming multiple eutectic material layers on multiple first electrode patterns, respectively, of a wiring substrate; mounting multiple semiconductor light-emitting elements with second electrode patterns on its lower surface on the multiple eutectic material layers, respectively; mounting a plate on the multiple semiconductor light-emitting elements via multiple eutectic temperature liquid layers, respectively, the multiple eutectic temperature liquid layers maintaining a liquid state even at a eutectic temperature of the multiple eutectic material layers; heating and cooling the multiple eutectic material layers and the multiple eutectic temperature liquid layers so that the multiple eutectic material layers are cured to multiple eutectic layers with the multiple first electrode patterns and the multiple second electrode patterns, while the plate is adhered via the multiple eutectic temperature liquid layers to the multiple semiconductor light-emitting elements by the surface tension phenomenon.

According to the presently disclosed subject matter, since the standard deviation σ1 of thicknesses of the transparent adhesive layers is small, the slopes of the semiconductor light-emitting elements caused by the eutectic process or thermally-pressuring process can be compensated for, and also, the heat resistances between the wavelength-converting plate and each of the semiconductor light-emitting elements can be uniform, so that luminance intensities of the semiconductor light-emitting elements can be uniform, and also, the color unevenness among the semiconductor light-emitting elements can be resolved.

BRIEF DESCRIPTION OF THE DRAWINGS

The above and other advantages and features of the presently disclosed subject matter will be more apparent from the following description of certain embodiments, as compared with the prior art, taken in conjunction with the accompanying drawings, wherein:

FIG. 3D is a timing diagram for explaining the eutectic process of FIG. 3C;

DETAILED DESCRIPTION OF EXEMPLARY EMBODIMENTS

Figure 1A:
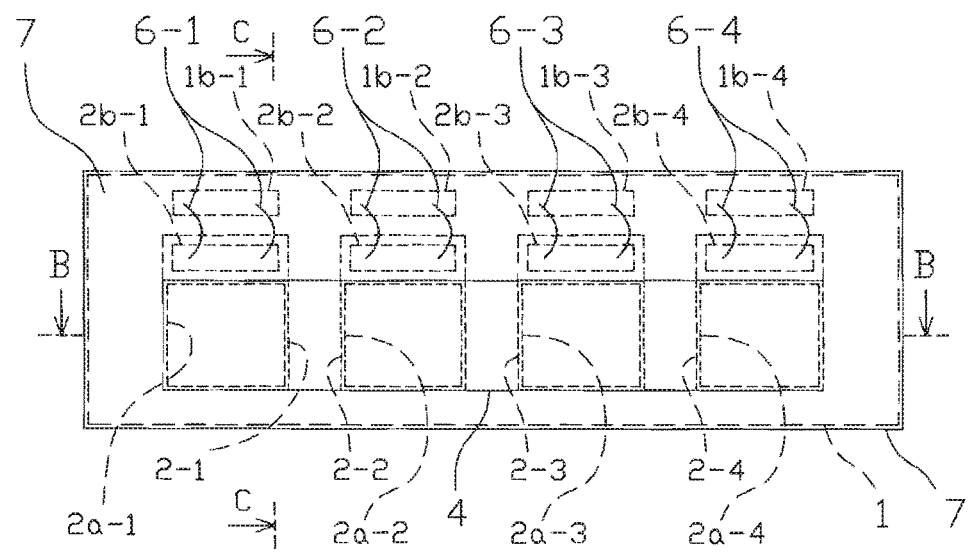
FIG. 1A is a plan view illustrating a first embodiment of the semiconductor light-emitting apparatus according to the presently disclosed subject matter.
Figure 1B:
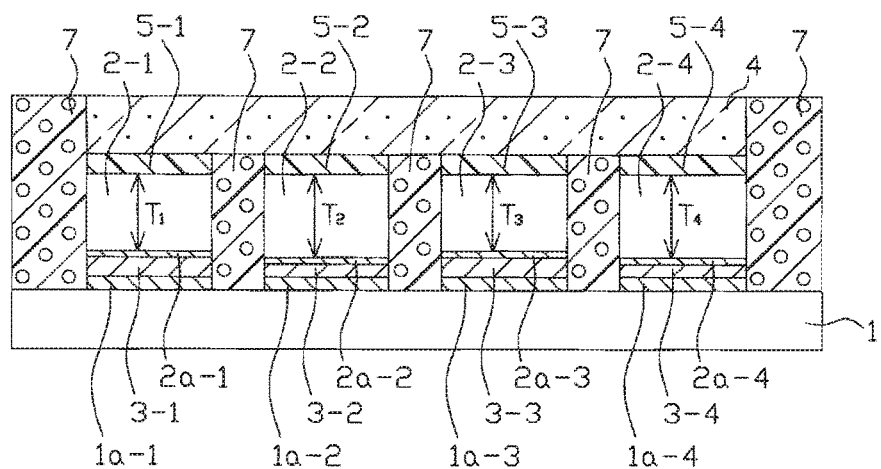
FIG. 1B is a cross-sectional view taken along the line B-B in FIG. 1A.
Figure 1C:
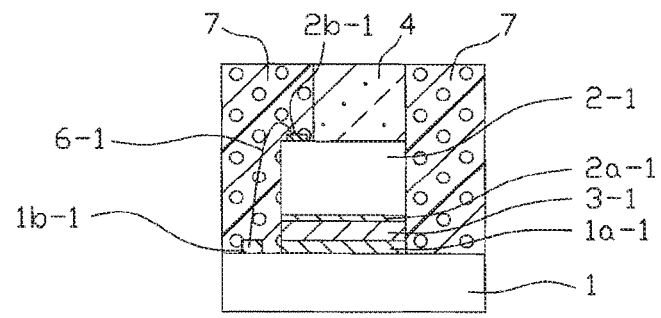
FIG. 1C is a cross-sectional view taken along the line C-C in FIG. 1A.

FIG. 1A is a plan view illustrating a first embodiment of the semiconductor light-emitting apparatus according to the presently disclosed subject matter, FIG. 1B is a cross-sectional view taken along the line B-B in FIG. 1A, and FIG. 1C is a cross-sectional view taken along the line C-C in FIG. 1A.

In FIGS. 1A, 1B and 1C, face-up type blue-light LED elements 2-1, 2-2, 2-3 and 2-4 are equidistantly mounted on a wiring substrate 1 via conductive eutectic layers 3-1, 3-2, 3-3 and 3-4, respectively. Also, a wavelength-converting plate 4 is mounted on upper surfaces of the LED elements 2-1, 2-2, 2-3 and 2-4 via transparent adhesive layers 5-1, 5-2, 5-3 and 5-4.

The substrate 1 has four p-side electrode patterns 1a-1, 1a-2, 1a-3 and 1a-4 and n-side electrode pads 1b-1, 1b-2, 1b-3 and 1b-4 on the upper surface. On the other hand, the LED elements 2-1, 2-2, 2-3 and 2-4 have p-side electrode patterns 2a-1, 2a-2, 2a-3 and 2a-4 on the lower surface and n-side electrode pads 2b-1, 2b-2, 2b-3 and 2b-4 on the upper surface.

Each of the p-side electrode patterns 1a-1, 1a-2, 1a-3 and 1a-4 of the substrate 1 and each of the p-side electrode patterns 2a-1, 2a-2, 2a-3 and 2a-4 of the LED elements 2-1, 2-2, 2-3 and 2-4 have about the same area. Also, the p-side electrode patterns 1a-1, 1a-2, 1a-3 and 1a-4 and the p-side electrode patterns 2a-1, 2a-2, 2a-3 and 2a-4 are made of Au or Au-plated with wettability. Therefore, when a eutectic process or a thermally pressuring process is performed between the p-side electrode patterns 1a-1, 1a-2, 1a-3 and 1a-4 and the p-side electrode patterns 2a-1, 2a-2, 2a-3 and 2a-4 sandwiching eutectic material layers, the circumferential surface of each of the uncured eutectic material layers except for the surfaces in contact with the p-side electrode patterns in a heated state is minimized due to their surface tension phenomenon, so that the p-side electrode patterns 2a-1, 2a-2, 2a-3 and 2a-4 are attracted to be completely coupled to the p-side electrode patterns 1a-1, 1a-2, 1a-3 and 1a-4, respectively, which is called a self-alignment effect.

Also, the heights of the upper surfaces of the LED elements 2-1, 2-2, 2-3 and 2-4 relative to the substrate 1 are about the same as each other. Therefore, the thicknesses of the transparent adhesive layers 5-1, 5-2, 5-3 and 5-4 are about the same as each other, or uniform.

On the other hand, the thicknesses $T_1$, $T_2$, $T_3$ and $T_4$ of the LED elements 2-1, 2-2, 2-3 and 2-4 would generally fluctuate. In this case, if the thicknesses of the p-side electrode patterns 1a-1, 1a-2, 1a-3 and 1a-4 are uniform and also, the thicknesses of the p-side electrode patterns 2a-1, 2a-2, 2a-3 and 2a-4 are uniform, the thicknesses of the eutectic layers 3-1, 3-2, 3-3 and 3-4 would fluctuate. As explained above, since the thicknesses of the transparent adhesive layers 5-1, 5-2, 5-3 and 5-4 are uniform, the standard deviation $\sigma 1$ of thicknesses of the transparent adhesive layers 5-1, 5-2, 5-3 and 5-4 is smaller than the standard deviation $\sigma 2$ of thicknesses of the eutectic layers 3-1, 3-2, 3-3 and 3-4.

The n-side electrode pads 1b-1, 1b-2, 1b-3 and 1b-4 of the substrate 1 are coupled by bonding wires 6-1, 6-2, 6-3 and 6-4 to the n-side electrode pads 2b-1, 2b-2, 2b-3 and 2b-4, respectively.

The LED elements 2-1, 2-2, 2-3 and 2-4 may be electrically connected either in series with each other or in parallel with each other.

A white-light reflective resin layer 7 surrounds the sidewalls of the LED elements 2-1, 2-2, 2-3 and 2-4 and the sidewall of the wavelength-converting plate 4 to confine light emitted from the LED elements 2-1, 2-2, 2-3 and 2-4 within the wavelength-converting plate 4.

The substrate 1 is made of AlN ceramic, for example.

The LED elements 2-1, 2-2, 2-3 and 2-4 are constructed by an epitaxially-grown structure including a p-type semiconductor layer, an active layer and an n-type semiconductor layer.

The eutectic layers 3-1, 3-2, 3-3 and 3-4 are made of AuSn, SnAg, SnCu, SnSb or SnSbAg which is prepared as paste or bumps.

The wavelength-converting plate 4 is constructed by a transparent resin plate made of silicone resin or epoxy resin into which phosphor such as $Y_3Al_5O_{12}:Ce^{+3}$(YAG) is dispersed, a phosphor-coated glass plate or a phosphor sintered ceramic plate.

The transparent adhesive layers 5-1, 5-2, 5-3 and 5-4 are made of silicone resin, epoxy resin, acryl resin polycarbonate resin or the like.

The bonding wires 6-1, 6-2, 6-3 and 6-4 are made of Au, for example.

The white-light reflective resin layer 7 is made of transparent resin such as silicone resin or epoxy resin and reflective fillers such as titanium dioxide ($TiO_2$), zinc oxide (ZnO) or alumina ($Al_2O_3$) dispersed into the transparent resin. A first method for manufacturing the semiconductor light-emitting apparatus of FIGS. 1A, 1B and 1C will be explained with reference to FIGS. 2A, 2B, 2C, 2D, 2E, 2F, 2G, 2H, 2I and 2J.

Figure 2A:
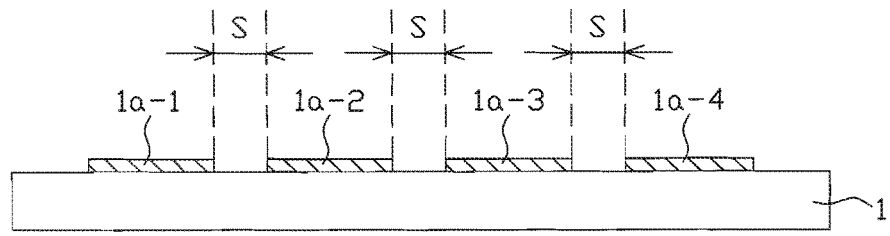
FIGS. 2A, 2B, 2C, 2D, 2E, 2F, 2G, 2H, 2I and 2J are cross-sectional views for explaining a first method for manufacturing the semiconductor light-emitting apparatus of FIGS. 1A, 1B and 1C.

First, referring to FIG. 2A, which shows a substrate preparing process, a wiring substrate 1 with equidistantly arranged p-side electrode patterns 1a-1, 1a-2, 1a-3 and 1a-4 and n-side electrode pads 1b-1, 1b-2, 1b-3 and 1b-4 (see FIGS. 1A and 1B) on the upper surface is prepared. In this case, the p-side electrode patterns 1a-1, 1a-2, 1a-3 and 1a-4 and the n-side electrode pads 1b-1, 1b-2, 1b-3 and 1b-4 are made of Au or Au-plated. Also, the spacing S between two adjacent ones of the p-side electrode patterns 1a-1, 1a-2, 1a-3 and 1a-4 is definite.

Figure 2B:
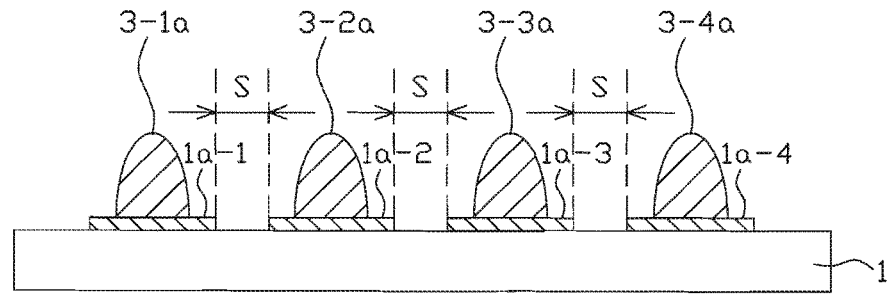

Next, referring to FIG. 2B, which shows an AuSn coating process, AuSn paste layers 3-1a, 3-2a, 3-3a and 3-4a are potted or coated on the p-side electrode patterns 1a-1, 1a-2, 1a-3 and 1a-4, respectively. In this case, the AuSn paste layers 3-1a, 3-2a, 3-3a and 3-4a are convex-shaped due to the surface tension phenomenon.

Figure 2C:
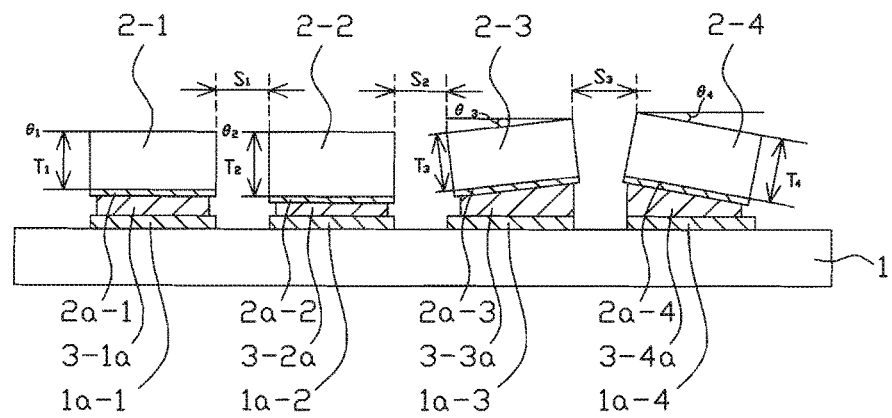

Next, referring to FIG. 2C, which shows an LED element mounting process, face-up type blue-light LED elements 2-1, 2-2, 2-3 and 2-4 associated with p-side electrode patterns 2a-1, 2a-2, 2a-3 and 2a-4 on their lower surfaces and n-side electrode pads 2b-1, 2b-2, 2b-3 and 2b-4 on their upper surfaces (see FIGS. 1A and 1C) are mounted by a mounter (not shown) on the AuSn paste layers 3-1a, 3-2a, 3-3a and 3-4a, respectively. The p-side electrode patterns 2a-1, 2a-2, 2a-3 and 2a-4 and the n-side electrode pads 2b-1, 2b-2, 2b-3 and 2b-4 are made of Au or Au-plated. In this case, the area of each of the LED elements 2-1, 2-2, 2-3 and 2-4 is about the same as that of each of the p-side electrode patterns 1a-1, 1a-2, 1a-3 and 1a-4 of the substrate 1. However, the thicknesses T1, T2, T3 and T4 of the LED elements 2-1, 2-2, 2-3 and 2-4 may generally fluctuate within an allowed range, and the gradient angles θ1, θ2, θ3 and θ4 of the LED elements 2-1, 2-2, 2-3 and 2-4 caused by the AuSn paste layers 3-1a, 3-2a, 3-3a and 3-4a may generally fluctuate within an allowed range. Therefore, the spacings S1, S2 and S3 between two adjacent ones of the LED elements 2-1, 2-2, 2-3 and 2-4 may be different from each other.

Figure 2D:
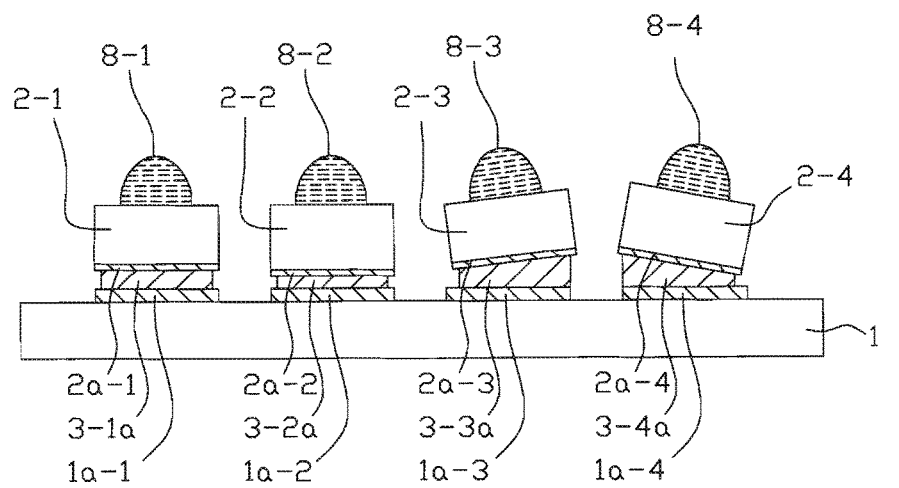

Next, referring to FIG. 2D, which shows a eutectic temperature liquid layer coating process, eutectic temperature liquid layers 8-1, 8-2, 8-3 and 8-4 made of silicone oil, for example, are potted or coated on the upper surfaces of the LED elements 2-1, 2-2, 2-3 and 2-4, respectively. The eutectic temperature liquid layers 8-1, 8-2, 8-3 and 8-4 maintain a liquid state even at the eutectic temperature (lowest melting point) of the eutectic paste layers 3-1a, 3-2a, 3-3a and 3-4a. Also, the amount of each of the eutectic temperature liquid layers 8-1, 8-2, 8-3 and 8-4 is adjusted so that the distance (=d) between the LED elements 2-1, 2-2, 2-3 and 2-4 and a glass plate 9 for supporting the semiconductor LED elements 2-1, 2-2, 2-3 and 2-4 in the process as illustrated in FIG. 2E is made to be on the order of µm such as 2 µm to 15 µm.

Figure 2E:
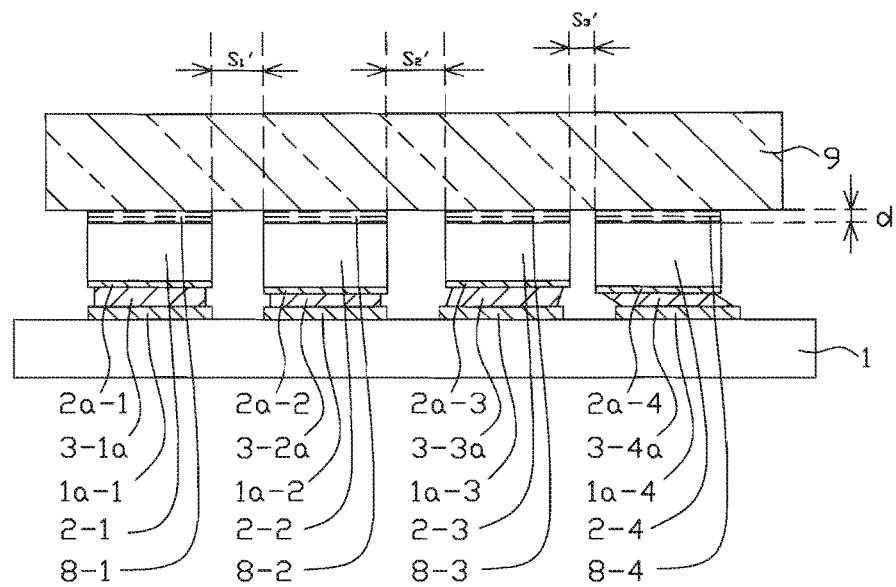

Next, referring to FIG. 2E, which shows a glass plate mounting process, a glass plate 5 is mounted on the eutectic temperature liquid layers 8-1, 8-2, 8-3 and 8-4, to support the LED elements 2-1, 2-2, 2-3 and 2-4. In this case, as stated above, the thickness d of the eutectic temperature liquid layers 8-1, 8-2, 8-3 and 8-4 is on the order of µm, for example, 2 µm to 15 µm. As a result, the glass plate 5 is adhered by the surface tension phenomenon of the eutectic temperature liquid layers 8-1, 8-2, 8-3 and 8-4 to the LED elements 2-1, 2-2, 2-3 and 2-4. Even in this state, the spacings $S_1'$, $S_2'$ and $S_3'$ between two adjacent ones of the semiconductor LED elements 2-1, 2-2, 2-3 and 2-4 would still fluctuate.

In FIG. 2E, if the thickness d is too large, the LED elements 2-1, 2-2, 2-3 and 2-4 are easily sloped relative to the glass plate 4, while if the thickness d is too small, gaps would be created between each of the LED elements 2-1, 2-2, 2-3 and 2-4 and the glass plate 4, so that, in a eutectic process, which will be explained later in FIG. 2F, flux would be leaked from the eutectic layers 3-1, 3-2, 3-3 and 3-4 through the sidewalls of the LED elements 2-1, 2-2, 2-3 and 2-4 into the above-mentioned gaps.

Figure 2F:
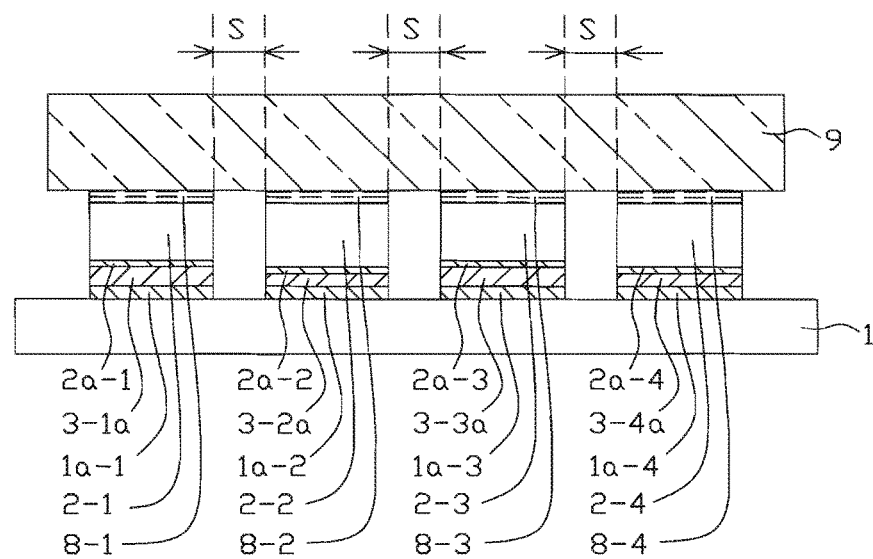

Next, referring to FIG. 2F, which shows a eutectic process or a thermal pressuring process, the entire apparatus is heated at a temperature higher than an eutectic temperature such as 300° C. As a result, the eutectic paste layers 3-1a, 3-2a, 3-3a and 3-4a are melted or uncured. In this case, although the LED elements 2-1, 2-2, 2-3 and 2-4 are adhered by the surface tension phenomenon of the eutectic temperature liquid layers 8-1, 8-2, 8-3 and 8-4 to the glass plate 9, the LED elements 2-1, 2-2, 2-3 and 2-4 can move along the horizontal direction, as the circumferential surfaces of the eutectic paste layers 3-1a, 3-2a, 3-3a and 3-4a are minimized due to the surface tension phenomenon. Therefore, the p-side electrode patterns 2a-1, 2a-2, 2a-3 and 2a-4 of the LED elements 2-1, 2-2, 2-3 and 2-4 are completely in self-alignment with the p-side electrode patterns 1a-1, 1a-2, 1a-3 and 1a-4, respectively, of the substrate 1. As a result, the spacings between two adjacent ones of the LED elements 2-1, 2-2, 2-3 and 2-4 are close to the spacings S between two adjacent ones of the p-side electrode patterns 1a-1, 1a-2, 1a-3 and 1a-4. Then, the eutectic paste layers 3-1a, 3-2a, 3-3a and 3-4a associated with the p-side electrode patterns 1a-1, 1a-2, 1a-3 and 1a-4 and the p-side electrode patterns 2a-1, 2a-2, 2a-3 and 2a-4 are cured to eutectic layers 3-1, 3-2, 3-3 and 3-4, respectively. Then, the apparatus is cooled.

Thus, even if there are fluctuations in the coated amounts of the eutectic paste layers 3-1a, 3-2a, 3-3a and 3-4a and there are fluctuations in the thicknesses $T_1$, $T_2$, $T_3$ and $T_4$ in the LED elements 2-1, 2-2, 2-3 and 2-4, since the upper surfaces of the LED elements 2-1, 2-2, 2-3 and 2-4 are maintained by the eutectic temperature liquid layers 8-1, 8-2, 8-3 and 8-4 to the glass plate 9 due to the surface tension phenomenon, so that the upper surfaces of the LED elements 2-1, 2-2, 2-3 and 2-4 are maintained at the same height.

Figure 2G:
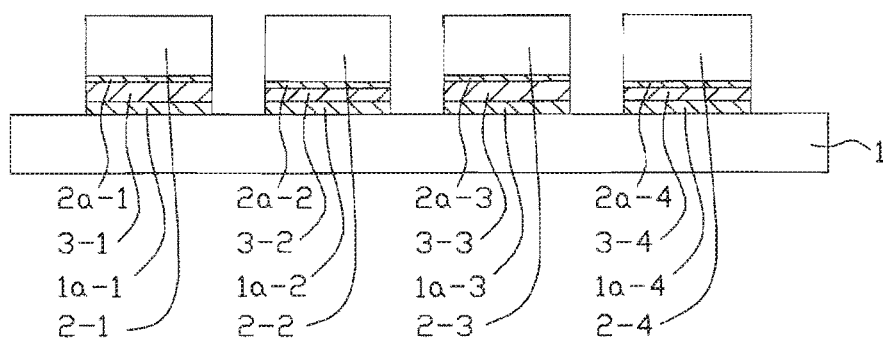

Next, referring to FIG. 2G, which shows a glass plate removing process, the eutectic temperature liquid layers 8-1, 8-2, 8-3 and 8-4 are dissolved by solvent such as toluene or xylene to remove the glass plate 9, and then, the upper surfaces of the LED elements 2-1, 2-2, 2-3 and 2-4 are cleaned by the above-mentioned solvent.

Next, a wire bonding process is performed upon the n-side electrode pads 1b-1, 1b-2, 1b-3 and 1b-4 of the substrate 1 and the n-side electrode pads 2b-1, 2b-2, 2b-3 and 2b-4 of the LED elements 2-1, 2-2, 2-3 and 2-4 (see FIGS. 1A and 1C), so that wires 6-1, 6-2, 6-3 and 6-4 are electrically connected between the n-side electrode pads 1b-1, 1b-2, 1b-3 and 1b-4 and respective ones of the n-side electrode pads 2b-1, 2b-2, 2b-3 and 2b-4.

Figure 2H:
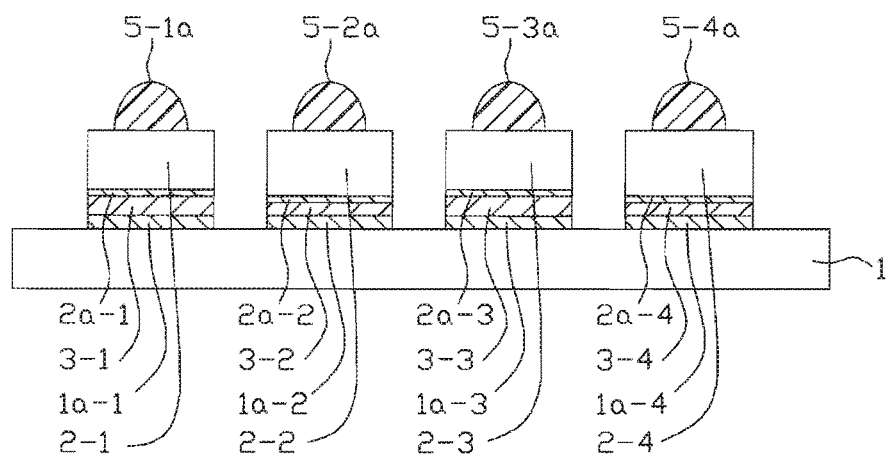

Next, referring to FIG. 2H, which shows an adhesive layer coating process, transparent adhesive layers 5-1, 5-2, 5-3 and 5-4 made of silicone resin or the like are potted or coated on the upper surfaces of the LED elements 2-1, 2-2, 2-3 and 2-4, respectively.

Figure 2I:
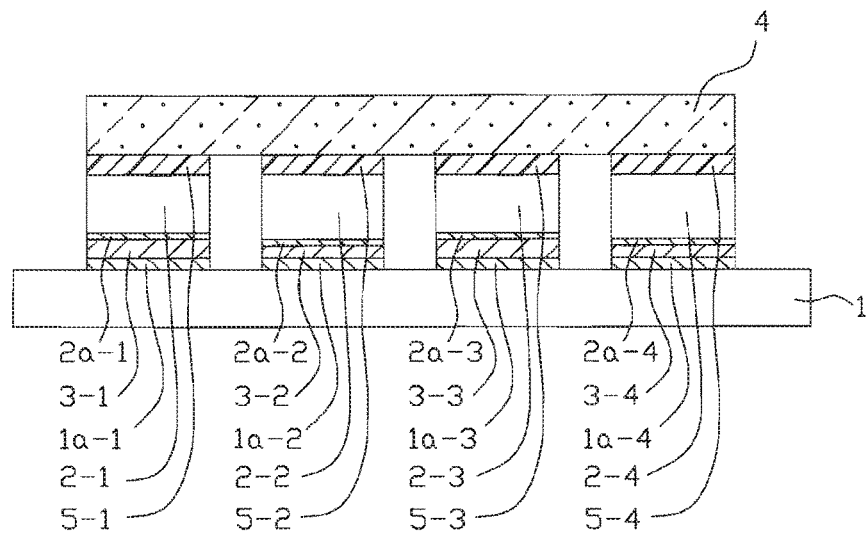

Next, referring to FIG. 2I, which shows a wavelength-converting plate mounting process, a wavelength-converting plate 4 is mounted on the upper surfaces of the LED elements 2-1, 2-2, 2-3 and 2-4 via the transparent adhesive layers 5-1, 5-2, 5-3 and 5-4.

Figure 2J:
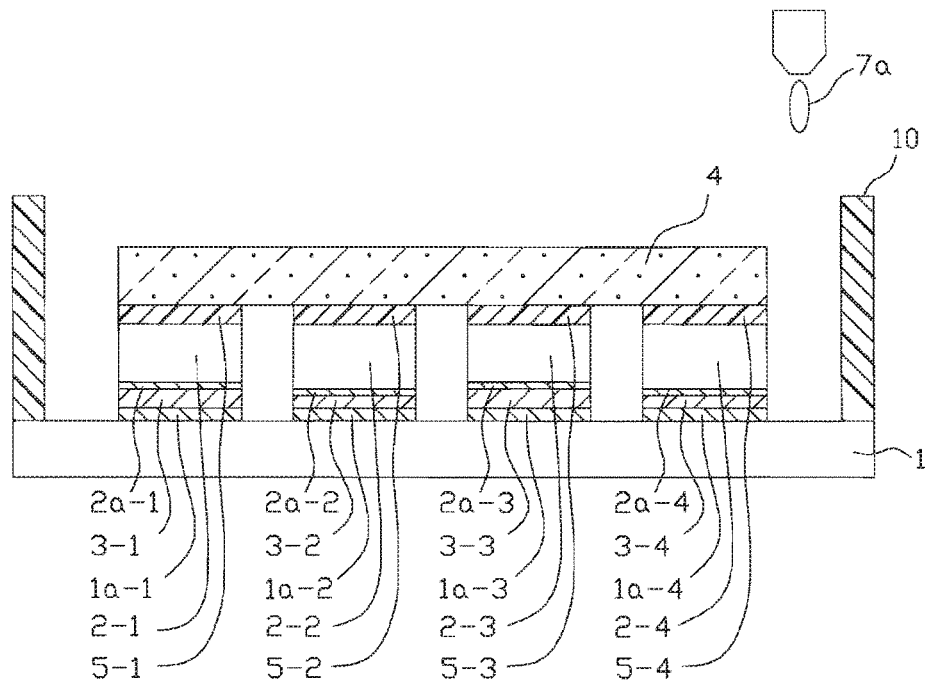

Finally, referring to FIG. 2J, which shows a reflective layer coating process, a rectangular frame 10 is placed on a periphery of an upper surface of the substrate 1 to surround the LED elements 2-1, 2-2, 2-3 and 2-4 and the wavelength-converting plate 4. Then, uncured reflective resin 7a is injected by a dispenser between the frame 10 and each of the cured eutectic layers 3-1, 3-2, 3-3 and 3-4, the LED elements 2-1, 2-2, 2-3 and 2-4 and the wavelength-converting plate 4. Then, the reflective resin 7a is cured so that a white-light reflective resin layer 7 is formed as illustrated in FIG. 1B.

Thus, according to the first manufacturing method, in spite of the fluctuations of the thicknesses $T_1$, $T_2$, $T_3$ and $T_4$ in the LED elements 2-1, 2-2, 2-3 and 2-4, the upper surfaces of the LED elements 2-1, 2-2, 2-3 and 2-4 whose standard deviation σ1 of thicknesses is small are adhered to the wavelength-converting plate 4 via the transparent adhesive layers 5-1, 5-2, 5-3 and 5-4 which are equal to each other. Therefore, the heat resistances between the wavelength-converting plate 4 and each of the LED elements 2-1, 2-2, 2-3 and 2-4 are equal to each other. As a result, the heat dissipation from the LED elements 2-1, 2-2, 2-3 and 2-4 to the wavelength-converting plate 4 can be uniform, so that the color distribution and the luminance distribution can be uniform, thus exhibiting a high reliability.

A second method for manufacturing the semiconductor light-emitting apparatus of FIGS. 1A, 1B and 1C will be explained with reference to FIGS. 3A, 3B and 3C as well as FIGS. 2A, 2B, 2C and 2J.

Even in the second method, the processes as illustrated in FIGS. 2A, 2B and 2C are carried out. That is, in a substrate preparing process, a wiring substrate 1 is prepared. Then, in a AuSn coating process, AuSn paste layers 3-1a, 3-2a, 3-3a and 3-4a are potted or coated on the p-side electrode patterns 1a-1, 1a-2, 1a-3 and 1a-4, respectively. Then, in an LED mounting process, face-up type blue-light LED elements 2-1, 2-2, 2-3 and 2-4 are mounted on the AuSn paste layers 3-1a, 3-2a, 3-3a and 3-4a, respectively.

Next, a wire bonding process is performed upon the n-side electrode pads 1b-1, 1b-2, 1b-3 and 1b-4 of the substrate 1 and the n-side electrode pads 2b-1, 2b-2, 2b-3 and 2b-4 of the LED elements 2-1, 2-2, 2-3 and 2-4 (see FIGS. 1A and 1C), so that wires 6-1, 6-2, 6-3 and 6-4 are electrically connected between the n-side electrode pads 1b-1, 1b-2, 1b-3 and 1b-4 and respective ones of the n-side electrode pads 2b-1, 2b-2, 2b-3 and 2b-4.

Figure 3A:
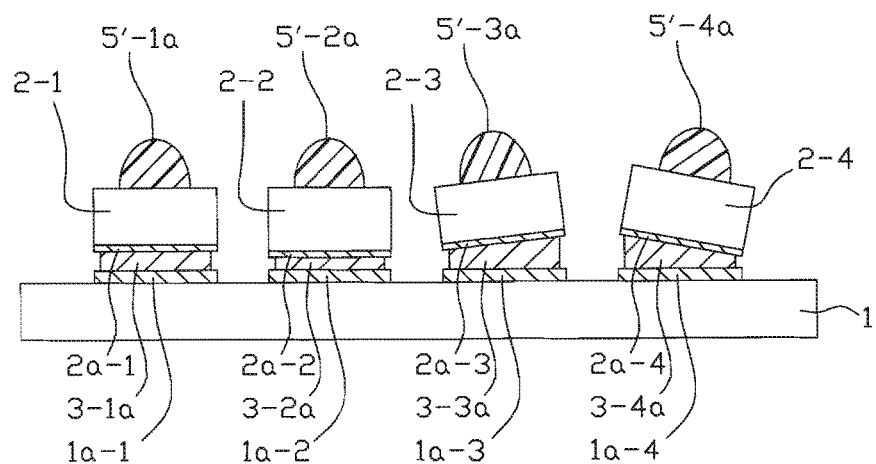
FIGS. 3A, 3B and 3C are cross-sectional views for explaining a second method for manufacturing the semiconductor light-emitting apparatus of FIGS. 1A, 1B and 1C.

Next, referring to FIG. 3A, eutectic temperature liquid transparent adhesive layers 5'-1a, 5'-2a, 5'-3a and 5'-4a made of silicone resin or the like are potted or coated on the upper surfaces of the LED elements 2-1, 2-2, 2-3 and 2-4, respectively.

Figure 3B:
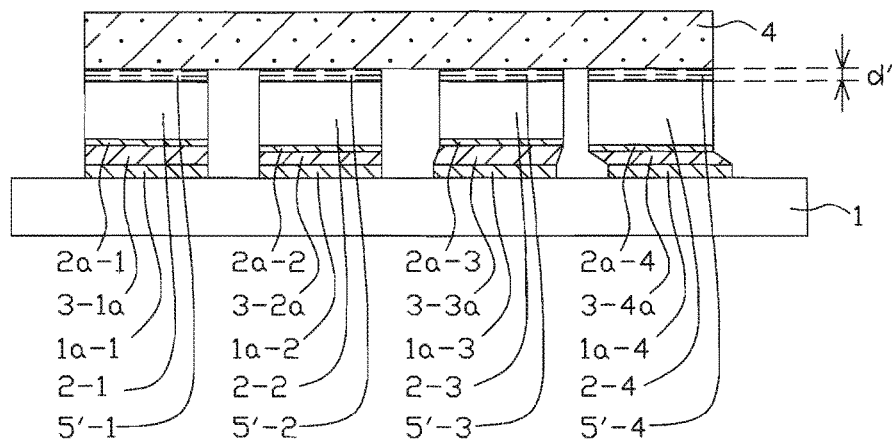

Next, referring to FIG. 3B, which shows a wavelength-converting plate mounting process, a wavelength-converting plate 4 is mounted on the upper surfaces of the LED elements 2-1, 2-2, 2-3 and 2-4 via the eutectic temperature liquid transparent adhesive layers 5'-1a, 5'-2a, 5'-3a and 5'-4a.

The eutectic temperature liquid transparent adhesive layers 5'-1a, 5'-2a, 5'-3a and 5'-4a maintain a liquid state even at the eutectic temperature (lowest melting point) of the eutectic paste layers 3-1a, 3-2a, 3-3a and 3-4a. Also, the amount of each of the eutectic temperature liquid transparent adhesive layers 5'-1a, 5'-2a, 5'-3a and 5'-4a is adjusted so that the distance (=d') between the LED elements 2-1, 2-2, 2-3 and 2-4 and the wavelength-converting plate 4 at the process as illustrated in FIG. 3B is made to be on the order of μm such as 2 μm to 4 μm, causing a surface tension phenomenon therebetween.

In FIG. 3B, if the thickness d' of the eutectic temperature liquid transparent adhesive layers 5'-1a, 5'-2a, 5'-3a and 5'-4a is too large, the LED elements 2-1, 2-2, 2-3 and 2-4 are easily sloped relative to the wavelength-converting plate 4, while if the thickness d' is too small, gaps would be created between each of the LED elements 2-1, 2-2, 2-3 and 2-4 and the wavelength-converting plate 4, so that, in an eutectic process, which will be explained later in FIG. 3C, flux would be leaked from the eutectic layers 3-1a, 3-2a, 3-3a and 3-4a through the sidewalls of the LED elements 2-1, 2-2, 2-3 and 2-4 into the above-mentioned gaps.

Figure 3C:
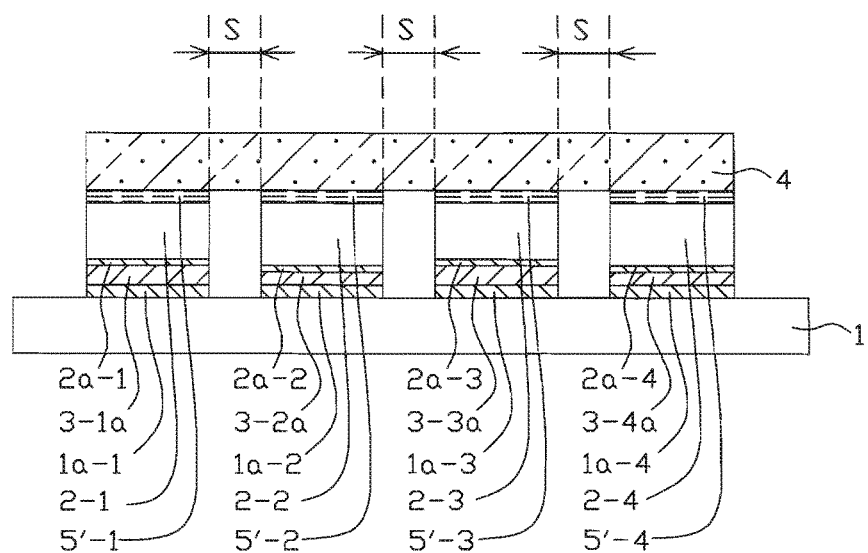

Next, referring to FIG. 3C, which shows a eutectic process or a thermal pressuring process, the entire apparatus is heated and cooled as shown in FIG. 3D. In FIG. 3D, the temperature TT of the entire apparatus is increased from room temperature RT ($t=t_0$) such as 20° C. to 30° C. via the thermosetting start point such as 150° C. of the eutectic temperature liquid transparent resin layers 5'-1, 5'-2, 5'-3 and 5'-4 ($t=t_1$) to a melting or eutectic start point such as 300° C. of the eutectic paste layers 3-1a, 3-2a, 3-3a and 3-4a or more ($t=t_2$). As a result, the eutectic temperature liquid transparent adhesive layers 5'-1, 5'-2, 5'-3 and 5'-4 starts thermosetting at time $t_1$, and then, the eutectic paste layers 3-1a, 3-2a, 3-3a and 3-4a starts melting (eutectic process) at time $t_2$. In this case, the eutectic temperature liquid transparent adhesive layers 5'-1, 5'-2, 5'-3 and 5'-4 is made of silicone resin which has a thermosetting start temperature is about 150° C. That is, in a heated and cooled state whose temperature temporarily becomes higher than the eutectic temperature such as 300° C., the eutectic temperature liquid transparent adhesive layers 5'-1, 5'-2, 5'-3 and 5'-4 start thermosetting at time $t_1$ and then, the entire apparatus is cooled at time $t_3$ to end the melting (eutectic) process; however, it will take a long time to reach the room temperature RT ending the thermosetting at time $t_4$ of FIG. 3D. In other words, the eutectic temperature liquid transparent adhesive layers 5'-1, 5'-2, 5'-3 and 5'-4 maintain a liquid state for a time period $TP_1$ from time $t_1$ to time $t_4$, thus exhibiting a low viscosity state. In this case, although the LED elements 2-1, 2-2, 2-3 and 2-4 are adhered by the surface tension phenomenon of the eutectic temperature liquid transparent adhesive layers 5'-1, 5'-2, 5'-3 and 5'-4 to the wavelength-converting plate 4, the LED elements 2-1, 2-2, 2-3 and 2-4 can move along the horizontal direction, as the circumferential surfaces of the eutectic paste layers 3-1a, 3-2a, 3-3a and 3-4a are minimized due to the surface tension phenomenon for a time period $TP_2$ from time $t_2$ to time $t_4$. As a result, the p-side electrode patterns 2a-1, 2a-2, 2a-3 and 2a-4 of the LED elements 2-1, 2-2, 2-3 and 2-4 are completely in self-alignment with the p-side electrode patterns 1a-1, 1a-2, 1a-3 and 1a-4, respectively. Simultaneously, the spacings between two adjacent ones of the LED elements 2-1, 2-2, 2-3 and 2-4 are close to the spacings S between two adjacent ones of the p-side electrode patterns 1a-1, 1a-2, 1a-3 and 1a-4. Thus, after the eutectic paste layers 3-1a, 3-2a, 3-3a and 3-4a associated with the p-side electrode patterns 1a-1, 1a-2, 1a-3 and 1a-4 and the p-side electrode patterns 2a-1, 2a-2, 2a-3 and 2a-4 are cured to eutectic layers 3-1, 3-2, 3-3 and 3-4, respectively, at time $t_3$ of FIG. 3D, the eutectic temperature liquid transparent adhesive layers 5'-1, 5'-2, 5'-3 and 5'-4 are cured at time $t_4$ of FIG. 3D. In this case, the thickness of the eutectic temperature liquid transparent adhesive layers 5'-1, 5'-2, 5'-3 and 5'-4 is 2 μm to 15 μm.

In view of the foregoing, the eutectic temperature liquid transparent adhesive layers 5'-1, 5'-2, 5'-3 and 5'-4 satisfy the following characteristic:

a time period $TP_1$ for the eutectic temperature liquid transparent adhesive layers 5'-1, 5'-2, 5'-3 and 5'-4 in a heated and cooled state whose temperature temporarily becomes higher than the eutectic temperature such as 300° C. of the eutectic paste layers 3-1a, 3-2a, 3-3a and 3-4a to change from a thermosetting starting point $t=t_1$ to a thermosetting ending point $t=t_4$ is larger than a time period $TP_2$ for the eutectic paste layers 3-1a, 3-2a, 3-3a and 3-4a in the above-heated and cooled state to change from a melting (eutectic) starting point t=t$_2$ to a cured (eutectic) ending point t=t$_2$. For example, TP$_1$ is 60 sec, and TP$_2$ is 10 sec depending on a time period where the temperature of the entire apparatus is higher than the eutectic temperature such as 300° C.

As occasion demands, curing delaying agents can be added to the eutectic temperature liquid transparent adhesive layers 5'-1, 5'-2, 5'-3 and 5'-4 to exhibit a more excellent characteristic.

Thus, even if there are fluctuations in the coated amounts of the eutectic paste layers 3-1a, 3-2a, 3-3a and 3-4a and there are fluctuations in the thicknesses T$_1$, T$_2$, T$_3$ and T$_4$ in the LED elements 2-1, 2-2, 2-3 and 2-4, since the upper surfaces of the LED elements 2-1, 2-2, 2-3 and 2-4 are maintained by the eutectic temperature liquid transparent adhesive layers 5'-1, 5'-2, 5'-3 and 5'-4 to the wavelength-converting plate 4 due to the surface tension phenomenon, the upper surfaces of the LED elements 2-1, 2-2, 2-3 and 2-4 are maintained at the same height.

Finally, referring to FIG. 2J, which shows a reflective layer coating process, a rectangular frame 10 is placed on a periphery of an upper surface of the substrate 1 to surround the LED elements 2-1, 2-2, 2-3 and 2-4 and the wavelength-converting plate 4. Then, uncured reflective resin 7a is injected by a dispenser between the frame 10 and each of the cured eutectic layers 3-1, 3-2, 3-3 and 3-4, the LED elements 2-1, 2-2, 2-3 and 2-4 and the wavelength-converting plate 4. Then, the reflective resin 7a is cured so that the reflective resin layer 7 is formed as illustrated in FIG. 1B.

According to the second manufacturing method as illustrated in FIGS. 2A, 2B and 2C, FIGS. 3A, 3B and 3C and FIG. 2J, when the wavelength-converting plate 4 is mounted on the LED elements 2-1, 2-2, 2-3 and 2-4, the heights of the upper surfaces of the LED elements 2-1, 2-2, 2-3 and 2-4 are made even in the same way as in the first manufacturing method. In this case, since the number of processes is smaller than that of the first manufacturing method, the second manufacturing method can be simplified as compared with the first manufacturing method. In addition, in the second manufacturing method, since the eutectic temperature liquid transparent adhesive layers 5'-1, 5'-2, 5'-3 and 5'-4 are thinner than the transparent adhesive layers 5-1, 5-2, 5-3 and 5-4 in the first manufacturing method, the heat resistances between the wavelength-converting plate 4 and each of the LED elements 2-1, 2-2, 2-3 and 2-4 are further reduced, so that the luminance intensities of the LED elements can be further increased.

Figure 4A:
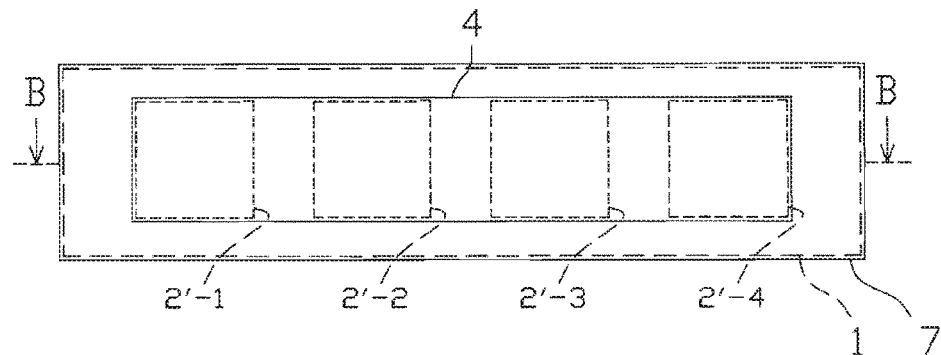
FIG. 4A is a cross-sectional view illustrating a second embodiment of the semiconductor light-emitting apparatus according to the presently disclosed subject matter.
Figure 4B:
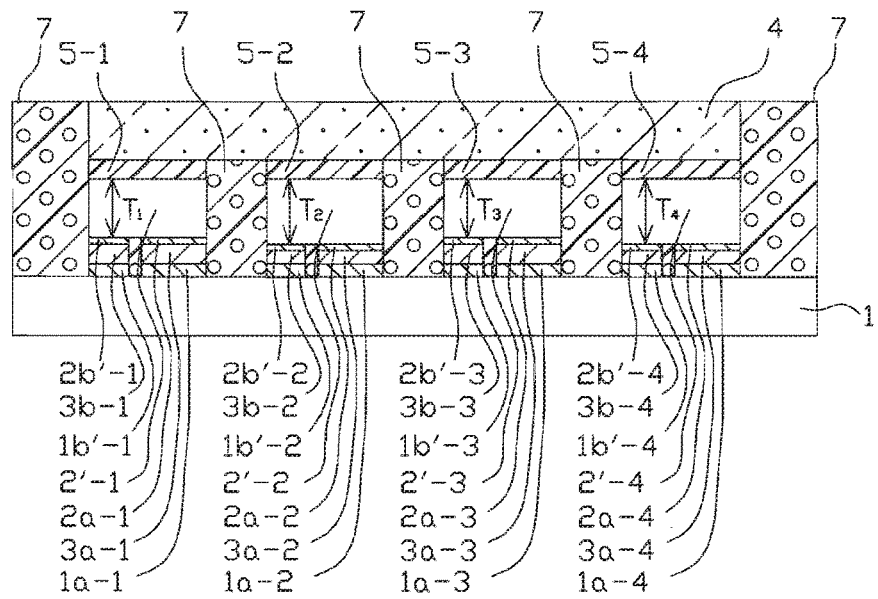
FIG. 4B is a cross-sectional view taken along the line B-B in FIG. 4A.
Figure 4C:
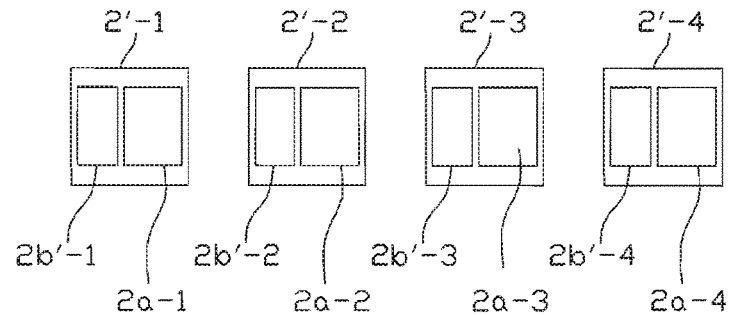
FIG. 4C is a bottom view of the LED elements of FIG. 4A.

FIG. 4A is a plan view illustrating a second embodiment of the semiconductor light-emitting apparatus according to the presently disclosed subject matter, FIG. 4B is a cross-sectional view taken along the line B-B in FIG. 4A, and FIG. 4C is a bottom view of the LED elements of FIG. 4A.

In FIGS. 4A, 4B and 4C, face-down type blue-light LED elements 2'-1, 2'-2, 2'-3 and 2'-4 are provided instead of the face-down type blue-light LED elements 2-1, 2-2, 2-3 and 2-4, respectively, of FIGS. 1A, 1B and 1C.

The substrate 1 has n-side electrode patterns 1b'-1, 1 b'-2, 1b'-3 and 1b'-4 instead of the n-side electrode pads 1b-1, 1b-2, 1b-3 and 1b-4, respectively, of FIGS. 1A, 1B and 1C. On the other hand, the LED elements 2'-1, 2'-2, 2'-3 and 2'-4 have n-side electrode patterns 2b'-1, 2b'-2, 2b'-3 and 2b'-4 on their lower surfaces corresponding to the n-side electrode patterns 1b'-1, 1b'-2, 1b'-3 and 1b'-4, respectively. In this case, the area of each of the n-side electrode patterns 2b'-1, 2b'-2, 2b'-3 and 2b'-4 is about the same as that of the n-side electrode patterns 1b'-1, 1b'-2, 1b'-3 and 1b'-4, respectively, of the substrate 1. Further, eutectic layers 3b-1, 3b-2, 3b-3 and 3b-4 are interposed between the n-side electrode patterns 1b'-1, 1b'-2, 1b'-3 and 1b'-4 and the n-side electrode patterns 2b'-1, 2b'-2, 2b'-3 and 2b'-4. Therefore, when a eutectic process is performed between the p-side electrode patterns 1a-1, 1a-2, 1a-3 and 1a-4 and the p-side electrode patterns 2a-1, 2a-2, 2a-3 and 2a-4 sandwiching the eutectic layers 3a-1, 3a-2, 3a-3 and 3a-4, the p-side electrode patterns 1a-1, 1a-2, 1a-3 and 1a-4 are attracted to be completely coupled to the p-side electrode patterns 2a-1, 2a-2, 2a-3 and 2a-4, respectively, by the cured eutectic layers 3a-1, 3a-2, 3a-3 and 3a-4, which is called a self-alignment effect. Simultaneously, in the above eutectic process, the n-side electrode patterns 2b'-1, 2b'-2, 2b'-3 and 2b'-4 are attracted to be completely coupled to the n-side electrode patterns 1b'-1, 1b'-2, 1b'-3 and 1b'-4, respectively, by the cured eutectic layers 3b-1, 3b-2, 3b-3 and 3b-4, which is called a self-alignment effect.

In FIGS. 4A, 4B and 4C, since no n-side electrode pads on the substrate 1 and no n-side electrode pads on the upper surface of the LED elements 2'-1, 2'-2, 2'-3 and 2'-4, no bonding wires are present.

The semiconductor light-emitting apparatus of FIGS. 4A, 4B and 4C can be manufactured by the method as illustrated in FIGS. 2A, 2B, 2C, 2D, 2E, 2F, 2G, 2H, 2I and 2J and FIGS. 4A, 4B and 4C, except that eutectic flux instead of eutectic paste is potted or coated on the p-side electrode patterns 1a-1, 1a-2, 1a-3 and 1a-4 and the n-side electrode patterns 1b'-1, 1b'-2, 1b'-3 and 1b'-4 of the substrate 1 in FIG. 4B and no wire bonding process is provided.

Figure 5:
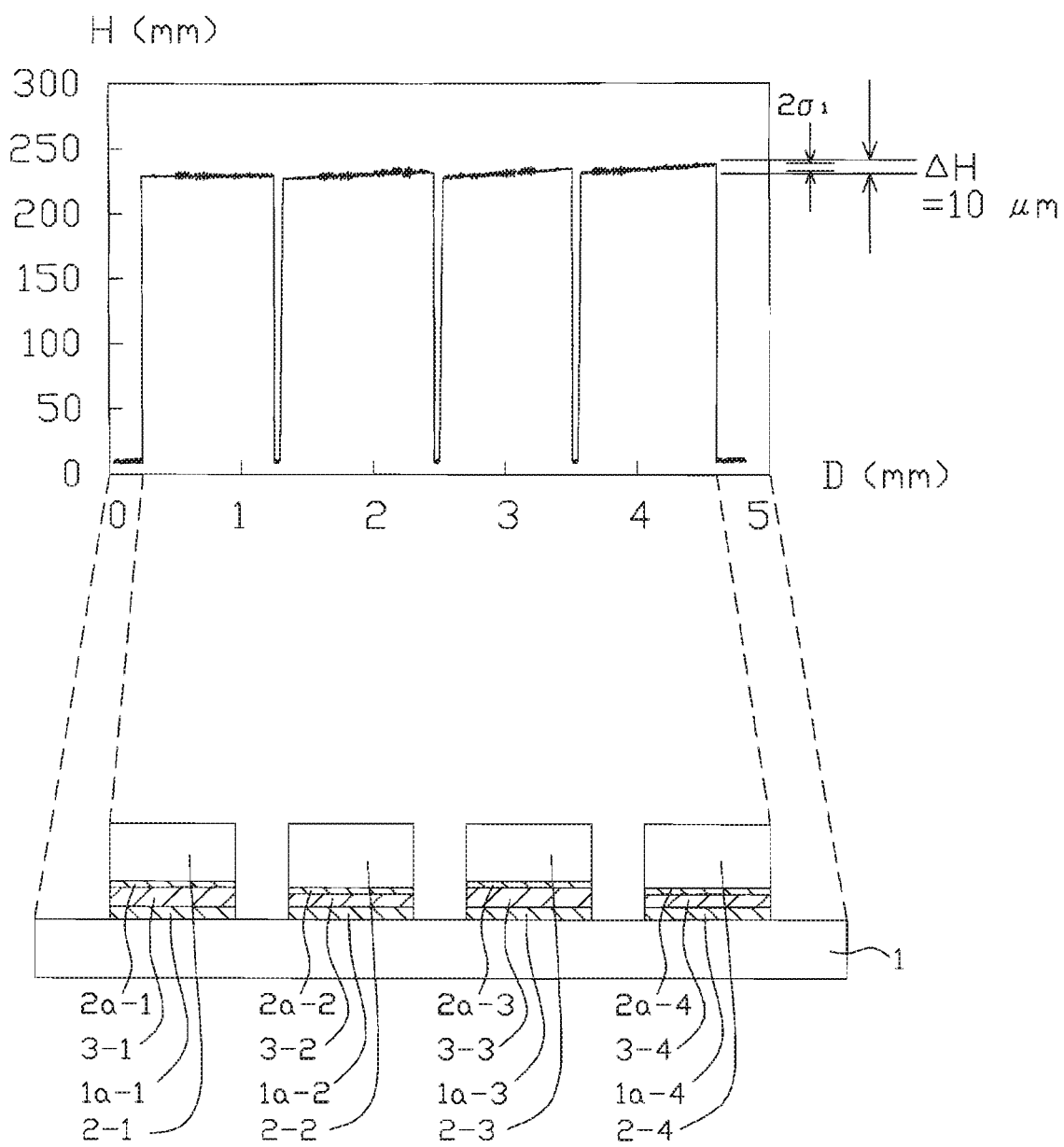
FIG. 5 is a graph showing heights of upper surfaces of semiconductor light-emitting elements according to the presently disclosed subject matter.

In FIG. 5, which is a graph showing the heights H of the LED elements 2-1, 2-2, 2-3 and 2-4 of FIG. 2G relative to the upper surface of the substrate 1, which are obtained by scanning the heights H with a laser displacement meter, D is a distance from the edge of the substrate 1. As shown in FIG. 5, the difference ΔH in height between the LED elements 2-1, 2-2, 2-3 and 2-4 is about 10 µm. In this case, since the transparent adhesive layers 5-1, 5-2, 5-3 and 5-4 are sandwiched by the wavelength-converting plate 4 and the LED elements 2-1, 2-2, 2-3 and 2-4, the standard deviation σ1 of thicknesses of the transparent adhesive layers 5-1, 5-2, 5-3 and 5-4 depends upon the upper surfaces of the LED elements 2-1, 2-2, 2-3 and 2-4 which are at the same level. Therefore, the standard deviation σ1 of thicknesses of the transparent adhesive layers 5-1, 5-2, 5-3 and 5-4 is smaller than ΔH=10 µm. On the other hand, the standard deviation σ2 of thicknesses of the eutectic layers 3-1, 3-2, 3-3 and 3-4 depends upon the standard deviation of thicknesses T1, T2, T3 and T4 of the LED elements 2-1, 2-2, 2-3 and 2-4 which would generally fluctuate under the condition that the patterns 1a-1, 1a-2, 1a-3 and 1a-4 and the patterns 2a-1, 2a-2, 2a-3 and 2a-4 are uniform. Therefore, the standard deviation σ2 of thicknesses of the eutectic layers 3-1, 3-2, 3-3 and 3-4 depends upon the standard deviation of thicknesses of the LED elements 2-1, 2-2, 2-3 and 2-4, and therefore, is relatively large. Actually, a plurality of semiconductor light-emitting apparatuses were manufactured by the first manufacturing method as illustrated in FIGS. 2A, 2B, 2C, 2D, 2E, 2F, 2G, 2H, 2I and 2J. Then, thicknesses of the transparent adhesive layers 5-1, 5-2, 5-3 and 5-4 in the semiconductor light-emitting apparatuses were measured. In this case, if the transparent adhesive layers 5-1, 5-2, 5-3 and 5-4 were sloped, thicknesses were measured at their centers. As a result, it was found that a standard deviation σ1 of thicknesses of the transparent adhesive layers 5-1, 5-2, 5-3 and 5-4 was smaller than a standard deviation σ2 of thicknesses of the eutectic layers 3-1, 3-2, 3-3 and 3-4.

The standard deviation σ1 of thicknesses of the transparent adhesive layers and the standard deviation σ2 of thicknesses of the eutectic layers according to the prior art semiconductor light-emitting apparatus will be explained with reference to FIG. 6. The prior art semiconductor light-emitting apparatus would be manufactured by the method as illustrated in FIGS. 2A, 2B, 2C, 2H, 2I and 2J. That is, the processes illustrated in FIGS. 2D, 2E, 2F and 2G are not carried out.

Figure 6:
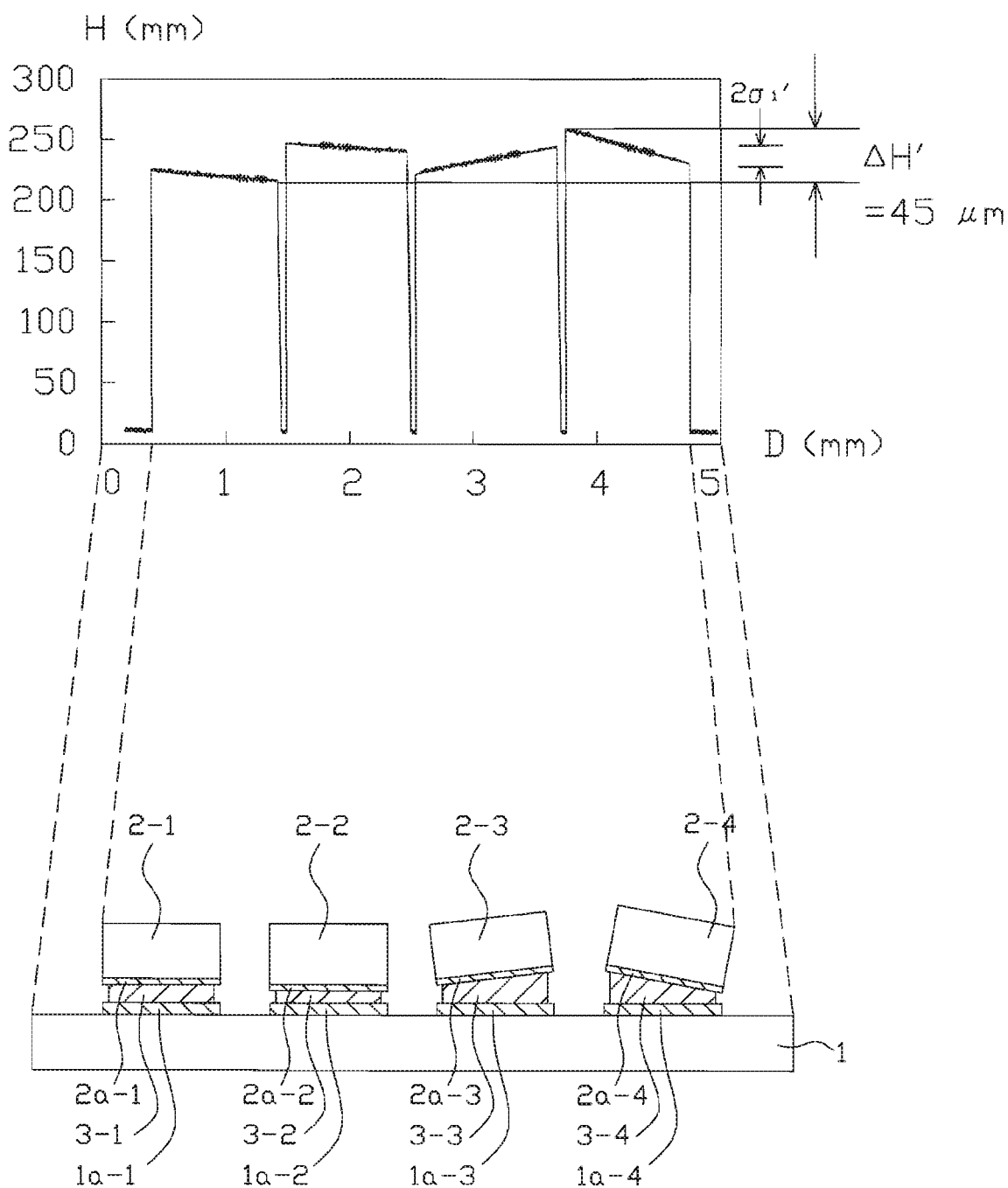
FIG. 6 is a graph showing heights of upper surfaces of semiconductor light-emitting elements according to the prior art.

In FIG. 6, which is a graph showing the heights H of the LED elements 2-1, 2-2, 2-3 and 2-4 of FIG. 2C relative to the upper surface of the substrate 1, which are obtained by scanning the heights H with a laser displacement meter, D is a distance from the edge of the substrate 1. As shown in FIG. 6, the difference ΔH' in height between the LED elements 2-1, 2-2, 2-3 and 2-4 is about 45 μm. Even in this case, since the transparent adhesive layers 5-1, 5-2, 5-3 and 5-4 is sandwiched by the wavelength-converting plate 4 and the LED elements 2-1, 2-2, 2-3 and 2-4, the standard deviation σ1' of thicknesses of the transparent adhesive layers 5-1, 5-2, 5-3 and 5-4 depends upon the standard deviation of heights H of the upper surfaces of the LED elements 2-1, 2-2, 2-3 and 2-4, i.e., depends upon the difference ΔH'. On the other hand, the standard deviation σ2' of thicknesses of the eutectic layers 3-1, 3-2, 3-3 and 3-4 would be reduced. Actually, a plurality of semiconductor light-emitting apparatuses were manufactured by the prior art manufacturing method. Then, thicknesses of the transparent adhesive layers 5-1, 5-2, 5-3 and 5-4 in the semiconductor light-emitting apparatuses were measured. In this case, if the transparent adhesive layers 5-1, 5-2, 5-3 and 5-4 were sloped, thicknesses were measured at their centers. As a result, it was found that a standard deviation σ1' of thicknesses of the transparent adhesive layers 5-1, 5-2, 5-3 and 5-4 is larger than a standard deviation σ2' of thicknesses of the eutectic layers 3-1, 3-2, 3-3 and 3-4. As illustrated in FIG. 5, note that the standard deviation σ1' is much smaller than the difference ΔH'. It was found that a standard deviation σ1' of thicknesses of the transparent adhesive layers 5-1, 5-2, 5-3 and 5-4 was larger than a standard deviation σ2' of thicknesses of the eutectic layers 3-1, 3-2, 3-3 and 3-4.

Note that a standard deviation σ of thicknesses is defined according to statistics. That, a standard deviation σ is a positive square root of the expected value of the square of the difference between a thickness and its mean.

Figure 7A:
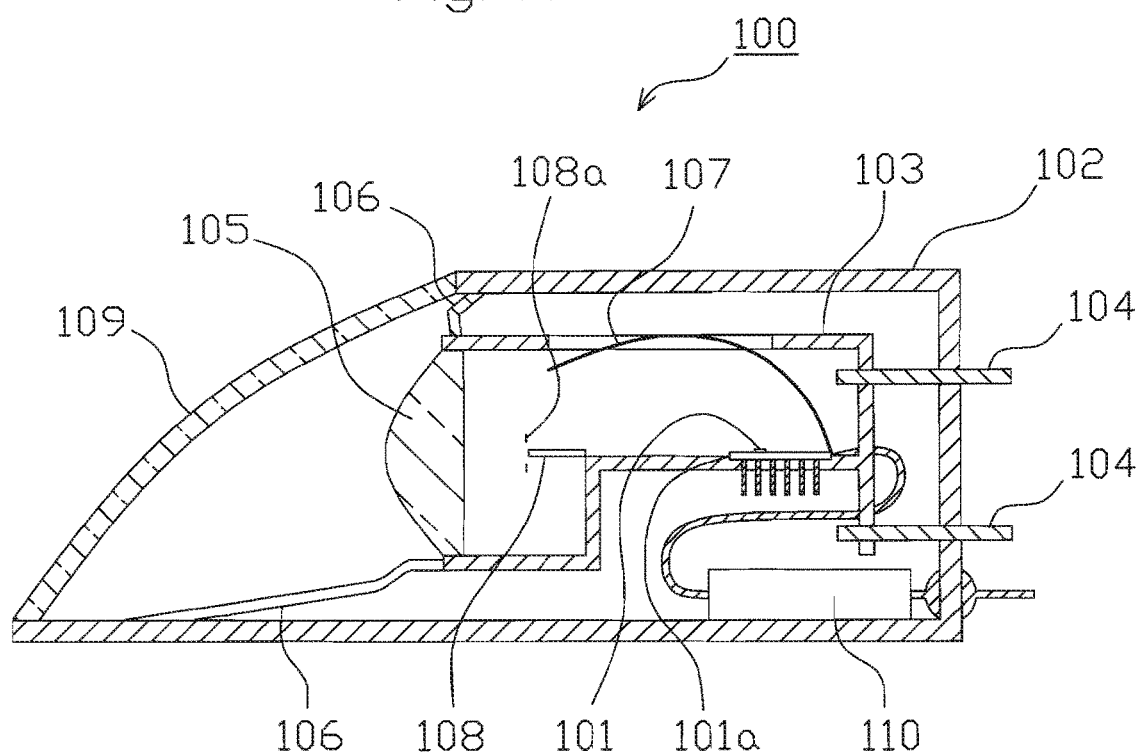
FIG. 7A is a cross-sectional view of a vehicle headlamp to which the semiconductor light-emitting apparatus of FIGS. 1A, 1B and 1C and FIGS. 4A, 4B and 4C are applied.

The semiconductor light-emitting apparatus according to the presently disclosed subject matter can be applied to a vehicle headlamp as illustrated in FIG. 7A where a vehicle headlamp 100 includes an optical source 101 formed by the semiconductor light-emitting apparatus of FIGS. 1A, 1B and 1C or FIGS. 4A, 4B and 4C.

In FIG. 7A, the vehicle headlamp 100 is constructed by a housing 102, a fixing member 103 fixing the optical source 101 via a heat sink 101a in the housing 102, optical axis aiming axes 104 for adjusting the direction of the fixing member 103 relative to the housing 102. Also, a concave-shaped inner lens 105 is fixed at a front position of the fixing member 103 which is supported by an extension 106 to the housing 102. Further, provided in the fixing member 103 are an elliptical concave-shaped reflector 107 and a shade 108 associated with a slit 108a for forming a cut-off line. Still further, an outer lens 109 is provided at a front portion of the housing 102. The optical source 101 is electrically connected to a power supply unit 110.

Figure 7B:
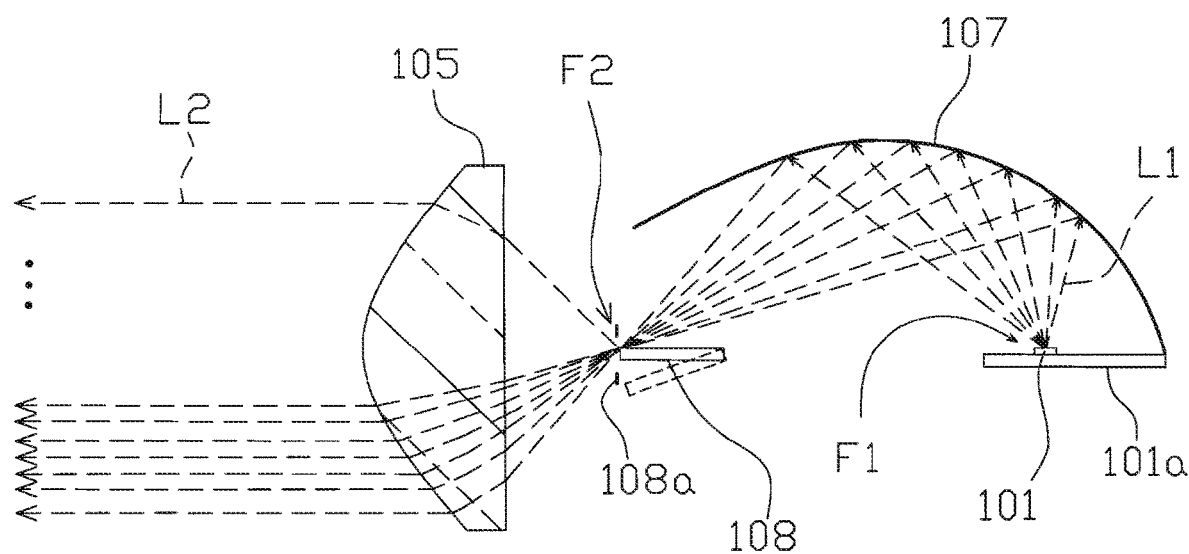
FIG. 7B is a view for explaining the operation of the vehicle headlamp of FIG. 7A.

The operation of the vehicle headlamp 100 of FIG. 7A is explained with reference to FIG. 7B which shows a low beam mode. In FIG. 7B, the position of the optical source 101 is a first focal point F1 of the elliptical concave-shaped reflector 107, while the position of the slit 108a of the shade 108 is not only a second focal point F2 of the elliptical concave-shaped reflector 107 but also a focal point of the concave-shaped inner lens 105.

As shown in FIG. 7B, a light beam L1 is emitted from the optical source 101 serving as the first focal point F1 and is reflected by the elliptical concave-shaped reflector 107. The light beam L1 reflected by the elliptical concave-shaped reflector 107 is converged at the slit 108a of the shade 108 serving as the second focal point F2. Since the slit 108a of the shade 108 serves as the focal point F2 of the inner concave-shaped lens 105, the light beam L1 is converted into parallel light L2.

A high beam mode operation of the vehicle headlamp 100 of FIG. 7A is carried out by rotating the shade 108 associated with the slit 108a.

In the above-described embodiments, the frame 10 is provided on the substrate 1. However, a congregated printed wiring substrate can be provided instead of the substrates 1. In this case, multiple LED elements and multiple wavelength-converting plates are mounted on the congregated substrate, and a frame is provided on a periphery of a surface of the congregated substrate. Then, a white-light reflective layer is potted and thermoset. Finally, the congregated wiring substrate is cut by blades into individual photodetection apparatuses.

In addition, in the above-described embodiments, four blue-light LED elements 2-1, 2-2, 2-3 and 2-4 are provided on the substrate 1; however; two, three, five or more blue-light LED elements can be provided on the substrate 1.

Further, in the above-described embodiments, blue-light LED elements are provided; however, other semiconductor light-emitting elements such as other LED elements or laser diode (LD) elements can be provided.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. A method for manufacturing a semiconductor light-emitting apparatus, the method comprising:
    forming multiple eutectic material layers on multiple first electrode patterns, respectively, of a wiring substrate;
    mounting multiple semiconductor light-emitting elements with second electrode patterns on their lower surfaces on said multiple eutectic material layers, respectively;
    mounting a plate on said multiple semiconductor light-emitting elements via multiple eutectic temperature liquid layers, respectively, said multiple eutectic temperature liquid layers maintaining a liquid state even at a eutectic temperature of said multiple eutectic material layers; and
    heating and cooling said multiple eutectic material layers and said multiple temperature liquid layers so that said multiple eutectic material layers are cured to multiple eutectic layers with said multiple first electrode patterns and said multiple second electrode patterns, while said plate is adhered via said multiple eutectic temperature liquid layers to said multiple semiconductor light-emitting elements by the surface tension phenomenon.

2. The method as set forth in claim 1, further comprising:
removing said plate and said eutectic temperature liquid layers after said heating and cooling; and
mounting a wavelength-converting plate via multiple transparent adhesive layers on said multiple semiconductor light-emitting elements after said removing.

3. The method as set forth in claim 2, wherein each of said multiple eutectic temperature liquid layers comprises silicone oil.

4. The method as set forth in claim 3, wherein said plate comprises a glass plate.

5. The method as set forth in claim 1, wherein said plate comprises a wavelength-converting plate.

6. The method as set forth in claim 5, further comprising forming a reflective layer surrounding sidewalls of said multiple semiconductor light-emitting elements and a sidewall of said wavelength-converting plate.

7. The method as set forth in claim 1, wherein:
each of said eutectic temperature liquid layers comprises a eutectic temperature liquid transparent adhesive layer which maintains a liquid state even at a eutectic temperature of said multiple eutectic layers,
a thermosetting temperature of said eutectic temperature liquid transparent adhesive layer is lower than said eutectic temperature, and
a time period for said eutectic temperature liquid transparent adhesive layer in a heated and cooled state whose temperature temporarily becomes higher than said eutectic temperature to change from a thermosetting starting point to a thermosetting ending point is larger than a time period for said multiple eutectic layers in said heated and cooled state to change from a eutectic starting point to a eutectic ending point.

8. The method as set forth in claim 7, wherein said eutectic temperature liquid transparent adhesive layer comprises silicone resin.

9. The method as set forth in claim 7, wherein a thickness of said eutectic temperature liquid transparent adhesive layer is 2 μm to 15 μm.

10. The method as set forth in claim 1, further comprising forming a reflective layer surrounding sidewalls of said multiple semiconductor light-emitting elements and a sidewall of said plate.

* * * * *